(12) United States Patent
Steinke

(10) Patent No.: US 6,992,487 B1
(45) Date of Patent: Jan. 31, 2006

(54) ARRANGEMENT FOR TESTING BATTERY WHILE UNDER LOAD AND CHARGING

(75) Inventor: Thomas O. Steinke, River Grove, IL (US)

(73) Assignee: La Marche Manufacturing Co., Des Plaines, IL (US)

( * ) Notice: Subject to any disclaimer, the term of this patent is extended or adjusted under 35 U.S.C. 154(b) by 363 days.

(21) Appl. No.: 10/447,596

(22) Filed: May 29, 2003

(51) Int. Cl.
 *G01N 27/416* (2006.01)
(52) U.S. Cl. ..................................... 324/426
(58) Field of Classification Search .............. 324/426, 324/427, 430, 433, 429
 See application file for complete search history.

(56) References Cited

U.S. PATENT DOCUMENTS

| | | | |
|---|---|---|---|
| 5,140,269 A | * | 8/1992 | Champlin ................... 324/433 |
| 5,250,904 A | * | 10/1993 | Salander et al. ............ 324/430 |
| 5,598,084 A | * | 1/1997 | Keith ......................... 320/109 |
| 5,744,962 A | | 4/1998 | Alber et al. |
| 6,417,668 B1 | | 7/2002 | Howard et al. |
| 6,441,584 B1 | | 8/2002 | Crass |
| 6,469,512 B2 | | 10/2002 | Singh et al. |
| 2002/0153864 A1 | | 10/2002 | Bertness |
| 2002/0175687 A1 | | 11/2002 | Bertness |
| 2003/0025481 A1 | | 2/2003 | Bertness |

* cited by examiner

*Primary Examiner*—Edward H. Tso
(74) *Attorney, Agent, or Firm*—Emrich & Dithmar LLC

(57) ABSTRACT

A live circuit battery tester allows for determining the condition of batteries under load without disconnecting the batteries and a battery charger from the load or in any way disrupting system operation during the test. Battery testing is prevented when the batteries are being used in an emergency or if they are recharging from a recent discharge. The battery tester is under microcomputer control and incorporates automatic-self diagnostics and provides a visual indication if the batteries are good or if a specific problem is detected such as if the batteries are missing, have open cells, are sulfated or are in imminent danger of failure. The battery tester determines if the charger is operating properly and tests for an open cell, bad battery connection, sulfated battery, and a weak battery and provides a visual indication of any of these problems as well as an indication of a properly operating battery.

13 Claims, 17 Drawing Sheets

TESTER COOLING TIME MONITOR

START TEST

ARRANGEMENT FOR TESTING BATTERY WHILE UNDER LOAD AND CHARGING

FIELD OF THE INVENTION

This invention relates to apparatus for testing the status of a battery in virtually any system and is particularly directed to determining the condition of a battery (or batteries) without disconnecting the battery from the system while the battery is under load without disrupting system operation.

BACKGROUND OF THE INVENTION

Batteries used in the generation of electrical energy can take on various forms. Two of the most common forms of batteries in use today are the dry cell battery and the lead-acid storage battery. Dry cell batteries were named because the electrolyte is typically comprised of a non-spillable paste-like substance. Dry cell batteries find widespread usage in such items as flashlights, portable radios, hearing aids, and other electrical devices which are frequently carried about by a user. Lead-acid storage batteries are comprised of a lead dioxide, lead plates, and aqueous sulfuric acid all disposed within a sealed container.

Batteries age over time with use and thus have limited life times. In the case of rechargeable batteries, a charger is frequently connected to the battery to maintain the battery in a fully charged state. The battery may also undergo frequent testing to determine its condition and provide an indication of expected continued operation. Current battery test procedures require disconnection or removal of the battery from its operating circuit. This type of testing not only typically requires human intervention, but also frequently results in system downtime. Disconnection of the battery from its associated load may require an alternative power source for temporary use or a separate backup power system, both of which increase the cost for ensuring reliable battery powered operation. In addition, while current battery testers are capable of providing an indication of current battery status, they do not provide an indication of possible imminent battery failure such as due to sulfation.

The present invention addresses the aforementioned limitations of the prior art by providing a live circuit battery testing arrangement to allow for the manual or automatic testing of batteries under computer control while the batteries are under load without disconnection from or interruptions in the operation of the system. The battery and its associated charger are not disconnected from the load during the battery test procedure and an indication is provided if the tester has failed and/or the charging system is inoperative. Battery testing is prevented when the batteries are being used in an emergency operation or if the batteries are being recharged following a recent discharge. The battery tester of the present invention also tests for and provides an indication of possible future battery failure such as due to sulfation.

OBJECTS AND SUMMARY OF THE INVENTION

Accordingly, it is an object of the present invention to provide a battery tester which can be installed in virtually any battery system having a battery string of 12–260 volts with a capacity ranging from 25 to at least 5000 ampere hours.

It is another object of the present invention to allow for testing of batteries under load without disconnecting the batteries or an associated charger from the load or in any way disrupting system operation.

Yet another object of the present invention is to provide a battery tester which can be either manually operated or programmed to automatically test periodically and provides realtime visual indications of various potential problems such as that the batteries are missing, have an open cell(s), are sulfated, or that failure is imminent.

A further object of the present invention is to provide for the testing of a battery having a charger with a remote equalized input and automatically initiating an equalized cycle in the event of the detection of battery sulfation indicating possible near term battery failure.

A still further object of the present invention is to test the status of a battery, or plural connected batteries, and provide an indication to the battery user of either imminent failure of the battery or likely failure of the battery within a more extended period.

This invention contemplates an arrangement for testing a battery connected to a battery charger and/or a load comprising: a first conductor means for connecting the battery to the battery charger and/or work load under normal operating conditions allowing the battery to drive the work load and the battery charger to charge the battery; a second conductor means coupled in parallel across the first conductor means, wherein the second conductor means is nonconductive under normal operating conditions; a user selectable means responsive to an input for initiating testing of the battery; and a control/detection means coupled to the first and second conductor means and to the selectable means for conducting a battery test, wherein the control/detection means renders the first conductor means nonconductive and the second conductor means conductive during a battery test for isolating the battery from the battery charger while permitting the battery to continue to energize the work load during testing, and wherein the control/detection means applies a test load across the battery for measuring battery voltage during testing.

The invention further contemplates a method for testing the condition of a battery connected to a battery charger and a work load comprising the steps of measuring a first output voltage $V_o$ of the battery; comparing the first output voltage $V_o$ with a float voltage $V_F$ and providing a first indication that the battery is charged if $V_o > V_F$; applying a test load to the battery and measuring a second output voltage under load $V_1$ and providing a second indication of an open cell in the battery if $V_1 < 0.75$ Vpc volts; and comparing the second output voltage under load $V_1$ to a reference voltage $V_R$, where $V_R < V_F$, and providing a third indication of a good battery if $V_1 > V_R$ or a fourth indication of a weak battery if $V_1 < V_R$.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENTS

Figure 1:
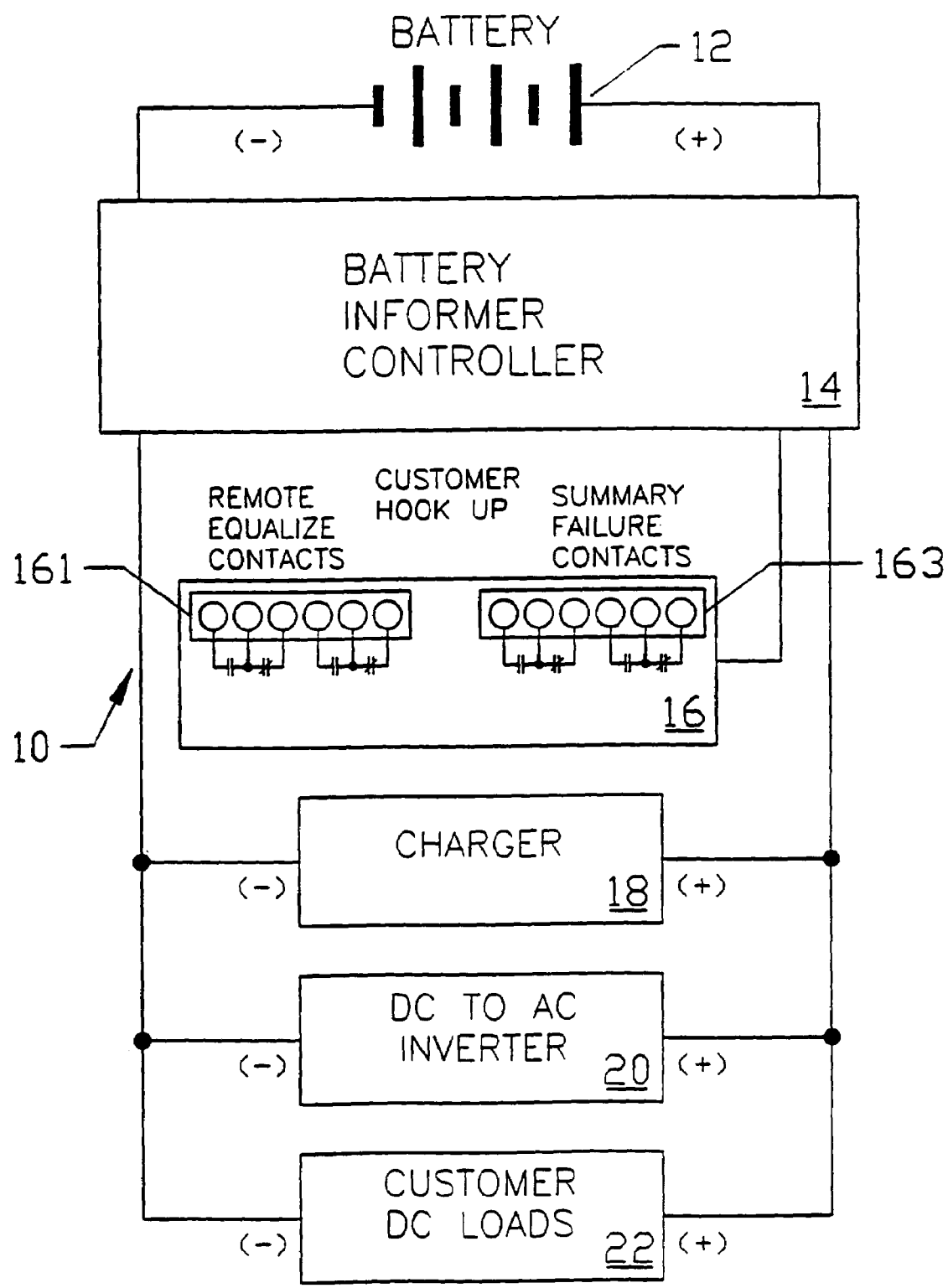
FIG. 1 is a simplified block diagram of a live circuit battery tester in accordance with the principles of the present invention.

Referring to FIG. 1, there is shown a simplified block diagram of a live circuit battery tester 10 in accordance with the present invention. The live circuit battery tester 10 includes a battery informer controller 14 connected to a battery 12 for testing the status of the battery. The battery informer controller 14 includes a relay output circuit 16 having first TS1 terminals 161 and second TS2 terminals 163. A user of the live circuit battery tester 10 can connect appropriate instruments to the aforementioned TS1 and TS2 terminals 161, 163 for receiving various signals indicating the status of battery 12 as it is tested. A battery charger 18 can be connected across the terminals of the battery informer controller 14 for maintaining battery 12 in a charged state. During testing, the battery 12 may remain connected to one or more DC loads 22 via the battery informer controller 14. Similarly, a DC-to-AC inverter 20 may be connected across the terminals of the battery informer controller 14 to allow the battery 12 to energize an AC load(s) which is not shown in the figure for simplicity. The DC load 22 and AC loads (not shown) remain connected to battery 12 via the battery informer controller 14 during testing of battery 12.

Figure 2:
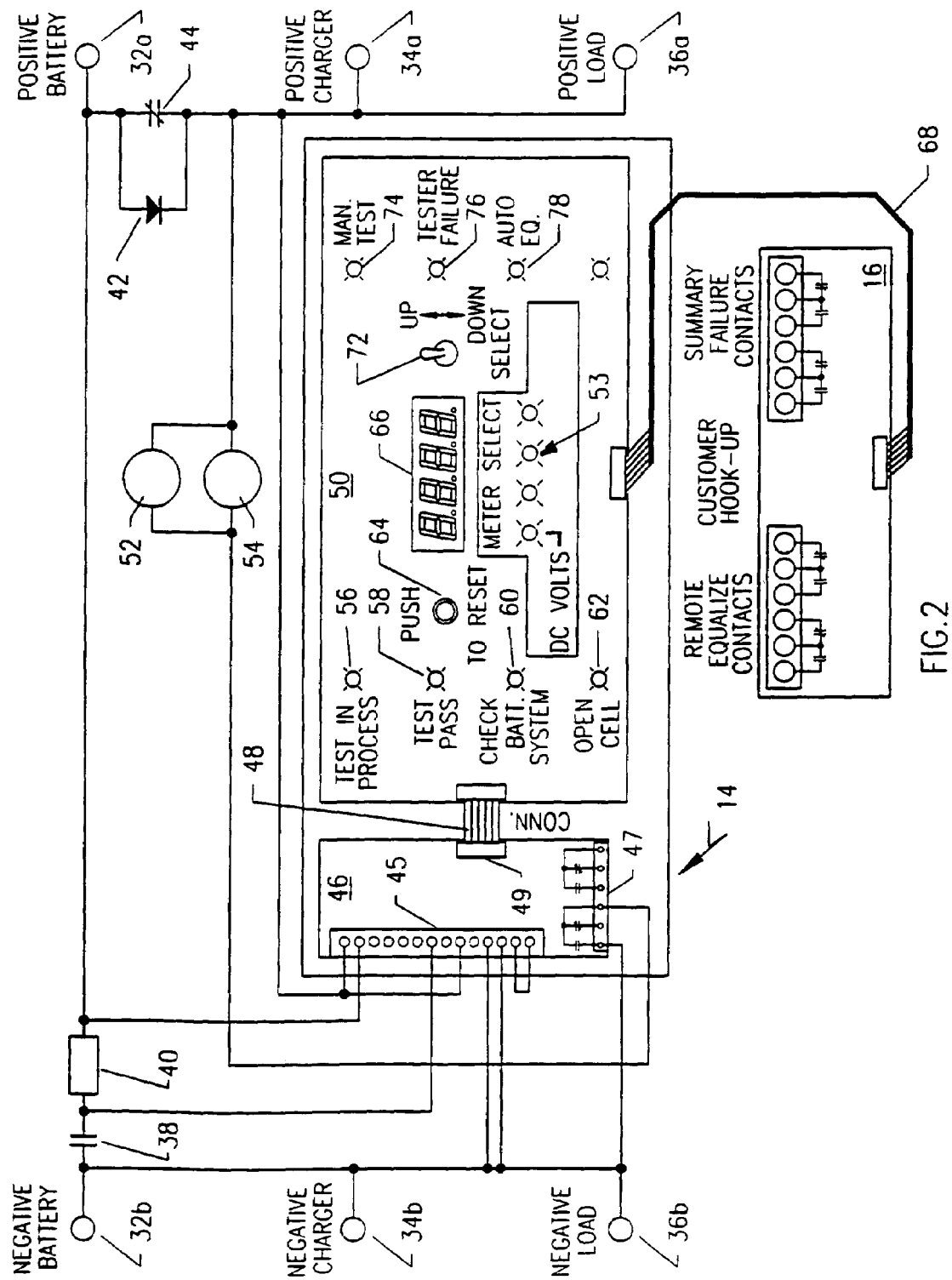
FIG. 2 is a combined block and schematic diagram of a battery test controller showing connections to a battery under test as well as outputs to a user of the tester in accordance with the present invention.

Referring to FIG. 2, there is shown in simplified schematic and block diagram form additional details of the battery informer controller 14 and the manner in which it is connected to a battery undergoing testing, a battery charger and a load. The battery, battery charger and load are not shown in FIG. 2 for simplicity. The battery informer controller 14 is connected to a battery by means of positive and negative terminals 32a and 32b. The battery informer controller 14 is further connected to a battery charger by means of positive and negative terminals 34a and 34b. Similarly, the battery informer controller 14 is coupled to DC and/or AC loads by means of positive and negative load terminals 36a and 36b. Connected in circuit between the battery and the charger and load(s) is the combination of a blocking diode 42 and relay contacts 44 which are connected in parallel. Also connected in this circuit across the battery and between the positive and negative battery terminals 32a and 32b is the combination of relay contacts 38 and a load resister 40 which provide a voltage drop across the battery for testing purposes. Also connected in this circuit are a CR coil 52 and a DK coil 54 respectively associated with relay contacts 38 and relay contacts 44. When power is applied to a coil, its associated relay contacts close rendering the relay contacts conductive. These circuit elements are connected to a J1 connector 45 of an electronic timer analog circuit 46 within the battery informer controller 14. Various input signals are provided from the battery to the J1 connector 45 of the electronic timer analog circuit 46, which signals are used in determining the status of the battery. In addition, outputs from a J2 connector 47 within the electronic timer analog circuit 46 to coils 52 and 54 and relay contacts 38 control the blocking diode 42 and relay contacts 44 in carrying out testing of a battery.

During normal operation when the battery is not being tested, relay contacts 44 are closed and diode 42 is non-conducting. In addition, relay contacts 38 are open and there is no voltage across resistor 40. Under these conditions, the loads are driven by the battery and the battery is charged by the battery charger via the closed relay contacts 44 as needed. The battery test inputs are provided to the J1 connector 45 in the electronic timer analog circuit 46. Upon either the manual or automatic selection of the battery test mode, appropriate outputs are provided from the J2 connector of the electronic timer analog circuit 46 to the relay coils 52 and 54 for opening of relay contacts 44 and closure of relay contacts 38 which places the battery voltage across resistor 40, with test inputs provided to the electronic timer analog circuit 46 via its J1 connector 45. During testing, the charger is disconnected from the battery because relay contacts 44 are open. But the battery remains connected to the load(s) via diode 42 and can energize the load(s) even while being tested and even if the battery charger fails. Thus, during battery testing the charger is isolated from the battery to ensure that the battery voltage and current are being measured and not system voltage and current. Following battery testing, relay contact 44 is again closed and relay contact 38 is opened. During non-testing, relay contacts 44 have been described as closed. However, the system could as easily be designed to close the relay contacts 44 during testing and open them when not testing. This later approach would require applying a voltage to the relay contacts 44 during testing only.

In the case of a power failure during a battery test, the battery will remain connected to the load through diode 42, thus providing power to the load. Relay contacts 44 disposed across diode 42 can have 30–60 volt contacts with only 1 volt applied across the relay contacts in a first direction, and slightly less than 30 volts applied across the relay contacts in a second, opposed direction. The battery informer controller 14 senses the battery voltage and either sends control signals or actuates relays for the purpose of controlling the relay contacts 44 and relay contacts 38. LEDs on an electronic timer digital circuit's control panel (described below) provide various visual indications of the operation and status of the battery being tested. The test conditions to which the battery is subjected allow various fault conditions such as an open cell, sulfated batteries, or tester failure to be determined.

Figure 3:
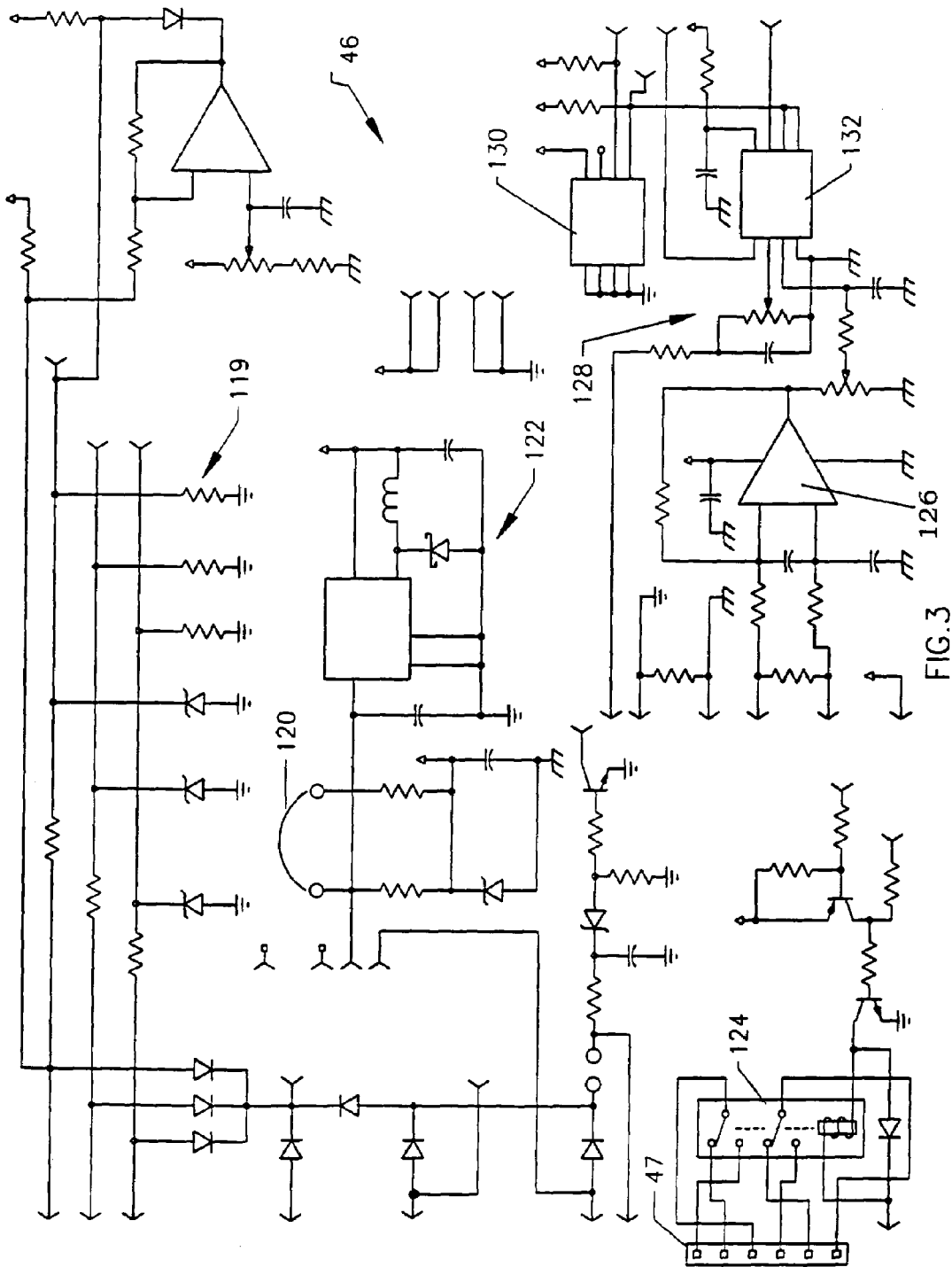
FIG. 3 is a combined block and schematic diagram of an electronic timer analog circuit for use in the live circuit battery tester of the present invention.

Referring to FIG. 3, there is shown a schematic diagram of the electronic timer analog circuit 46 within the battery informer controller 14. The electronic timer analog circuit 46 includes a power supply 122 coupled by means of a jumper wire 120 and a voltage divider network to the J1 connector. An input voltage to the J1 connector drives the switching power supply 122 which outputs a level +5 VDC to power the electronic timer digital circuit described below. Other inputs are provided to voltage clamping and conditioning circuitry 119 within the electronic timer analog circuit 46 which includes several Zener diodes for providing precisely controlled output voltage signals to the electronic timer digital circuit. Additional inputs to the electronic timer analog circuit's J1 connector are from the load positive bus, the load negative bus, and the switch end of the load resistor 40. The electronic timer analog circuit 46 further includes a relay circuit 124 coupled to the J3 connector 49 for receiving digital inputs from the electronic timer digital circuit 50 for controlling the operation of the blocking diode 42 and relay contacts 38 and 44 via relay contacts within the J2 connector 47. The electronic timer analog circuit 46 further includes the combination of an amplifier 126, voltage divider 128, a first and second digital-to-analog converters 130 and 132 for receiving inputs from the battery under test and providing corresponding conditioned outputs by means of a J3 connector 49 to a P3 connector 51 of the electronic timer digital circuit 50. The J3 (jack) and P3 (plug) connectors 49, 51 are coupled by means of a ribbon cable 48.

Figure 4:
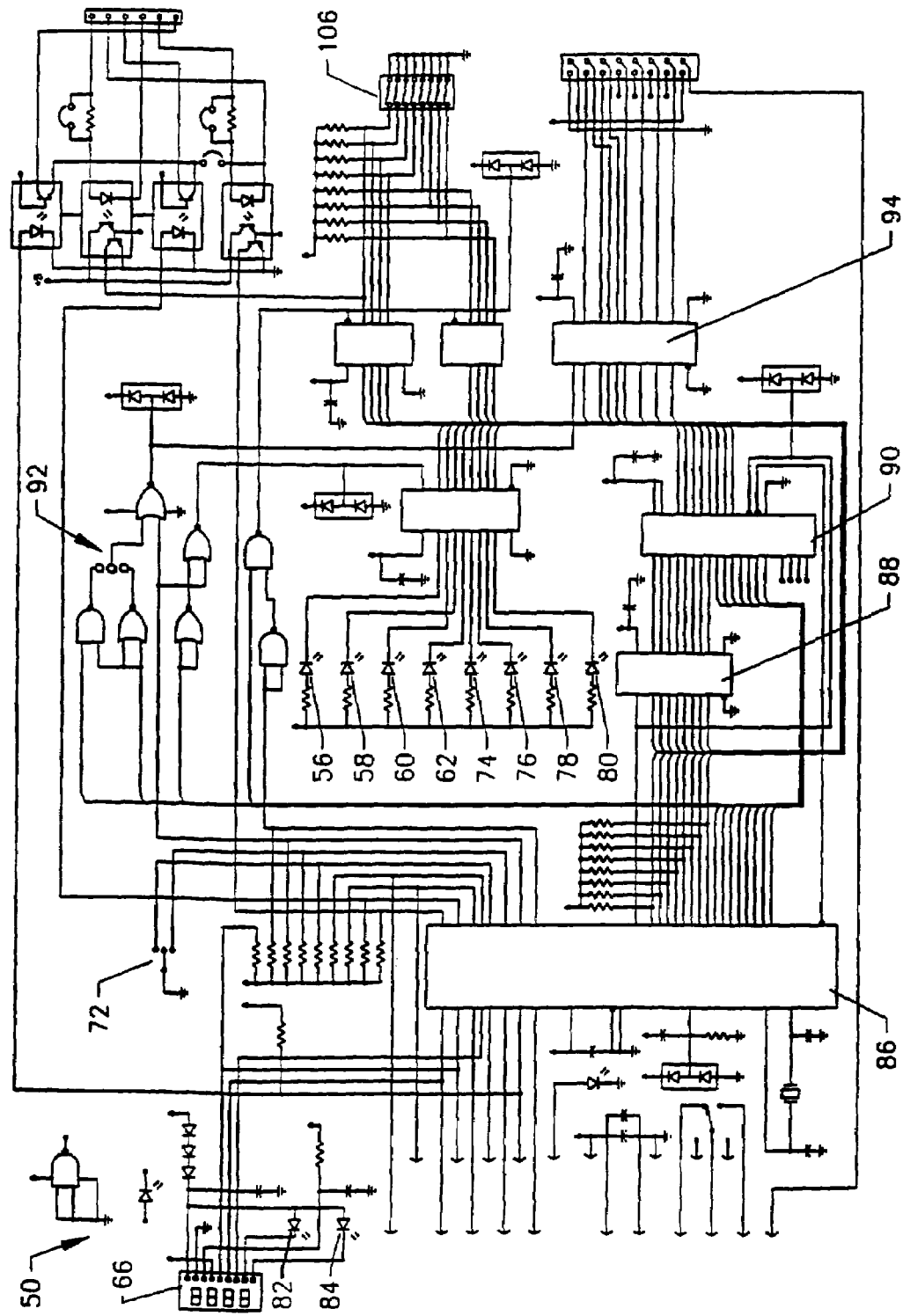
FIG. 4 is a combined block and schematic diagram of an electronic timer digital circuit for use in the live circuit battery tester of the present invention.

An outer control panel of the electronic timer digital circuit 50 is shown in FIG. 2, while a schematic diagram of the electronic timer digital circuit is shown in FIG. 4. The electronic circuit digital circuit 50 includes various LEDs for providing a visual indication of the status of a battery being tested as well as the operation of the live circuit battery tester. More specifically, the control panel of the electronic timer digital circuit 50 shown in FIG. 2 includes a yellow test-in-process indicator 56 for indicating that a battery is currently being tested. The electronic timer digital circuit 50 further includes a green test pass indicator 60 indicating successful passing of the test administered by the live circuit battery tester by a battery. Also included in the display panel of the electronic timer digital circuit 50 is a red check battery system indicator 60 for alerting an operator to a possible problem with the battery undergoing testing. The electronic timer digital circuit further includes a red open cell indicator 62 for providing a visual indication that a battery undergoing test has an open cell. A push-to-reset button 64 is provided on the electronic timer digital circuit's display panel to allow an operator to reset the live circuit battery tester to the beginning of a test procedure. Also included on the electronic timer digital circuit's display panel is a red manual test mode indicator 74, a red test failure indicator 76, and a red auto equalizer indicator 78. The auto equalizer indicator 78 illuminates when a battery fails a test, where the failure is not due to an open cell in the battery. An LED display 66 is also provided on the electronic timer digital circuit's display panel for displaying various characteristics of the battery undergoing testing as well as information regarding the status of the test being administered to the battery. The electronic timer digital circuit's display panel further includes a multi-mode select switch 72 having up and down positions for selecting various modes of operation as well as for selecting the parameters for presentation on the LED display 66. Plural LEDs 53 below the LED display 66 on the electronic timer digital circuit's control panel provide a visual indication of the parameter presently being displayed.

Referring specifically to FIG. 4, additional details of the electronic timer digital circuit 50 will now be described. The electronic timer digital circuit 50 includes a microprocessor 96, which in a preferred embodiment is the 8031 microprocessor, for carrying out the operations involved in the testing of a battery which are described in detail below. Microprocessor 86 generates timing signals and reads digital voltages and processes this data with respect to corresponding digital reference values. Microprocessor 86 is coupled to and drives the LED display 66 on the control panel of the electronic timer digital circuit 50 as well as first and second LEDs 82 and 84 disposed below the LED display and respectively representing DC amps and DC volts. Microprocessor 86 includes a random access memory (RAM) (not shown) for storing system constants. The electronic timer digital circuit 50 further includes a read only memory (ROM) 90 within which is stored an operating program described in detail below and which is coupled to the microprocessor 86 by means of a driver latch 88. Another driver latch 94 within the electronic timer digital circuit 50 conditions output signals provided via a J7 connector 68 from the electronic timer digital circuit 50 to the relay output circuit 16. The electronic timer digital circuit 50 further includes a digital switch 106 for manually setting initial conditions of the system, such as the battery tester's calibration timer, which are used to program microprocessor 86. The electronic timer digital circuit 50 also includes the aforementioned select switch 72, as well as the aforementioned plural LEDs 56, 58, 60, 62, 74, 76, 78 and 80 for providing a visual indication of the operation of the battery tester and the status of a battery being tested which were described in detail above. An array of logic gates 92 condition signals from the microprocessor 86 for use by either the electronic timer digital circuit 50 or by other components of the battery tester.

Figure 5:
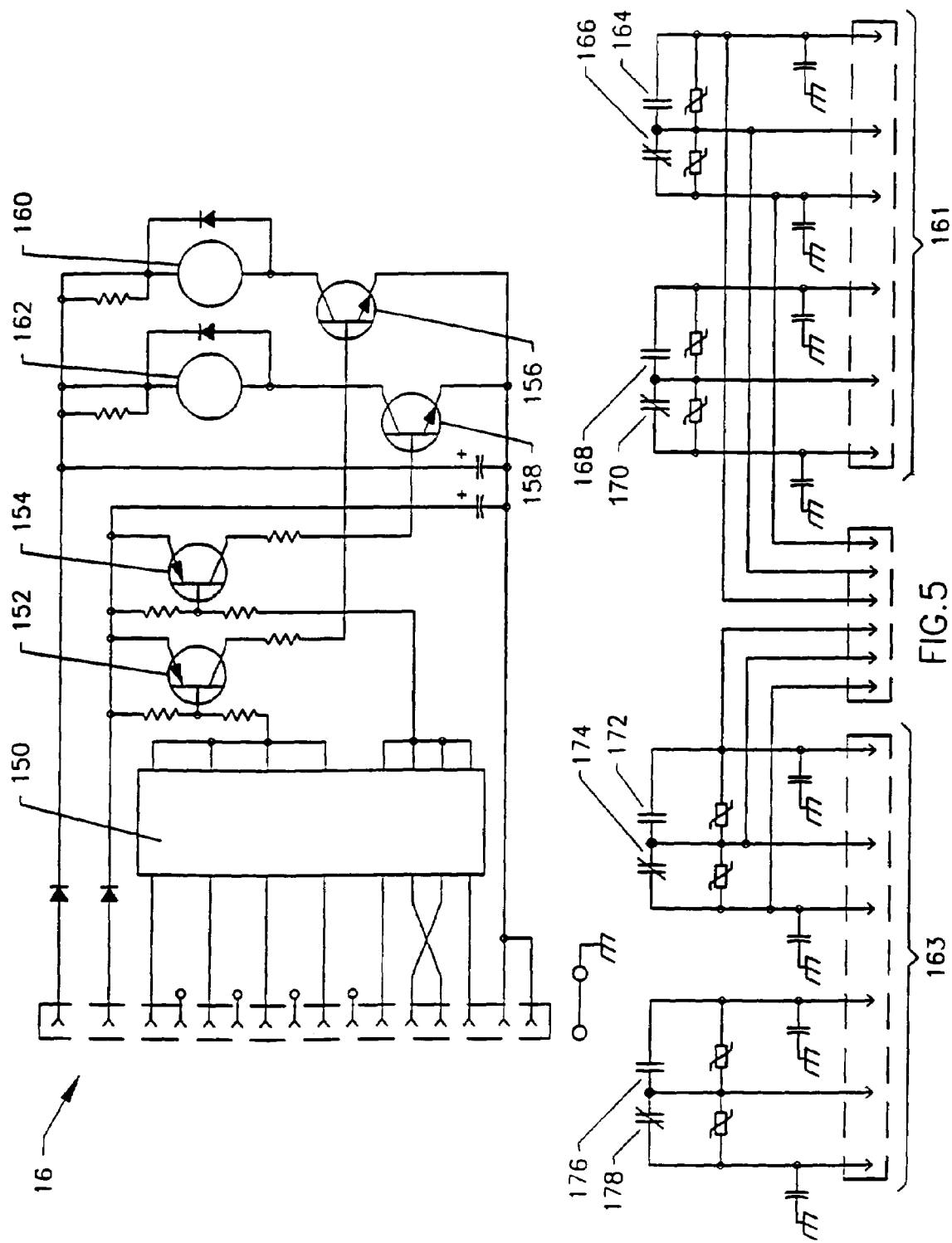
FIG. 5 is a schematic diagram of a relay output circuit for use in the live circuit battery tester of the present invention.

FIG. 5 is a schematic diagram of the relay output circuit 16 of the live circuit battery tester of the present invention. Relay output circuit 16 includes a DIP switch 150 which receives signals from the battery tester's electronic timer digital circuit 50 by means of J7 connector 68 and performs address decoding. Outputs from the DIP switch 150 are provided to PNP transistors 152 and 154 which, in turn, are respectively coupled to NPN transistors 158 and 156. The output of NPN transistor 156 is provided to a first coil 160, while the output of NPN transistor 158 is provided to a second coil 162. First and second coils 160, 162 respectively drive relay contacts 164, 166, 168, 170 and relay contacts 172, 174, 176, 178 at the output of the relay output circuit 16 for controlling whether the battery tester operates in a normal test mode or an equalized test mode, or in a normal voltage mode or a high voltage mode. The relay output circuit 16 also includes TS1 connections 161 and TS2 connections 163. A first pair of normally open contacts 164 and 168 and a second pair of normally closed contacts 166 and 170 are coupled to the TS1 connections 161. Similarly, a first pair of normally open contacts 172 and 176 and second pair of normally closed contacts 174 and 178 are coupled to the TS2 connections 163. Thus, the first set of relay contacts 164, 166, 168, 170 and the TS1 connections 161 are used in the equalize mode of operation, while the second set of relay contacts 172, 174, 176, 178 and the TS2 connections 163 are used in the normal test mode of operation. In the equalize test mode, the charger voltage to the battery is increased resulting in an increase in the voltage in all of the battery's cells in order to reduce battery sulfation. The equalize test mode is automatically initiated upon the detection of a weak battery. It is these normally opened and normally closed contacts coupled to the various output connections which control the outputs of the battery tester which are provided to user peripherals which are not shown in the figure for simplicity.

Battery tester failure is determined by measuring the voltage across the test load resistor 40 or across relay contacts 38. The absence of a voltage across resistor 40 indicates that a test is not in process, while a voltage across the resistor indicates that a test is in process. The battery informer controller 14 monitors the voltage across resistor 40. If it is decided to use the voltage across the relay contacts 38, then a voltage across the relay contacts indicates that the contacts are open. If the test indicates that there is no voltage across relay contacts 38, then the contacts are closed. The battery informer controller 14 monitors the voltage across either relay contacts 38 or resistor 40 and determines when the contacts should be opened or closed. If relay contacts 38 are in the wrong state, the battery tester has failed and an appropriate alarm is actuated. If the status of the voltage across resistor 40 indicates that a battery test is in process with the battery informer controller 14 not having initiated the test, a failure has occurred and an appropriate visual indication is provided. If the voltage indicates that no test is in process after the battery informer controller 14 has initiated a test, a failure has also occurred which is indicated by actuation of the summary alarm with an appropriate LED indication provided on the electronic timer digital circuit's front control panel. The battery charger voltage is monitored to determine if a test should be initiated. By using this voltage, a charger failure indicator may be energized with an optional relay. Charger failure is defined as the charger voltage dropping below 2.05 Vpc (low voltage), with the check battery system LED illuminating and an optional relay changing state.

Figure 6:
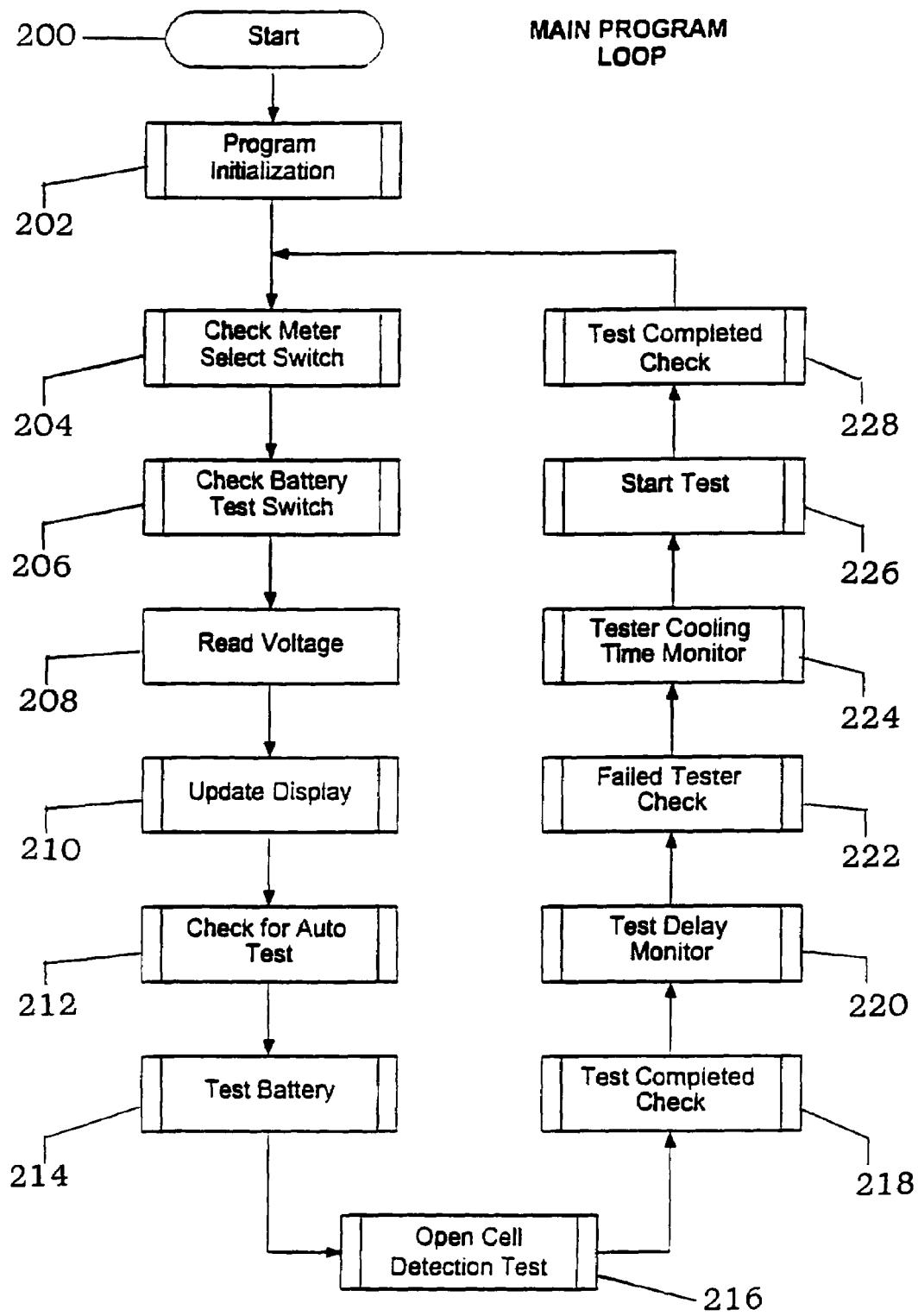
FIG. 6 is a flowchart showing the main loop of an operating program used in the inventive live circuit battery tester carried out under the control of a microprocessor.

Referring to FIG. 6, there is shown a main program loop in the form of a flow chart consisting of a series of steps carried out under the control of microprocessor 86 within the electronic timer digital circuit 50 in carrying out the present invention. Microprocessor 86 carries out the sequence of steps shown in the flowchart of FIG. 6 in cooperation with other components shown in FIG. 4, particularly ROM 90 within which is stored the operating program for carrying out the inventive process shown in FIG. 6. In FIG. 6, each rectangular block having a pair of spaced end lines represents an operation carried out under the control of microprocessor 86, while a simple rectangle in the figure represents system measurements made and recorded under the control of the microprocessor. Each of the individual operations, or steps, undertaken in carrying out the main program loop shown in FIG. 6 is shown in greater detail in a respective subsequent figure and is described in detail below.

Figure 7:
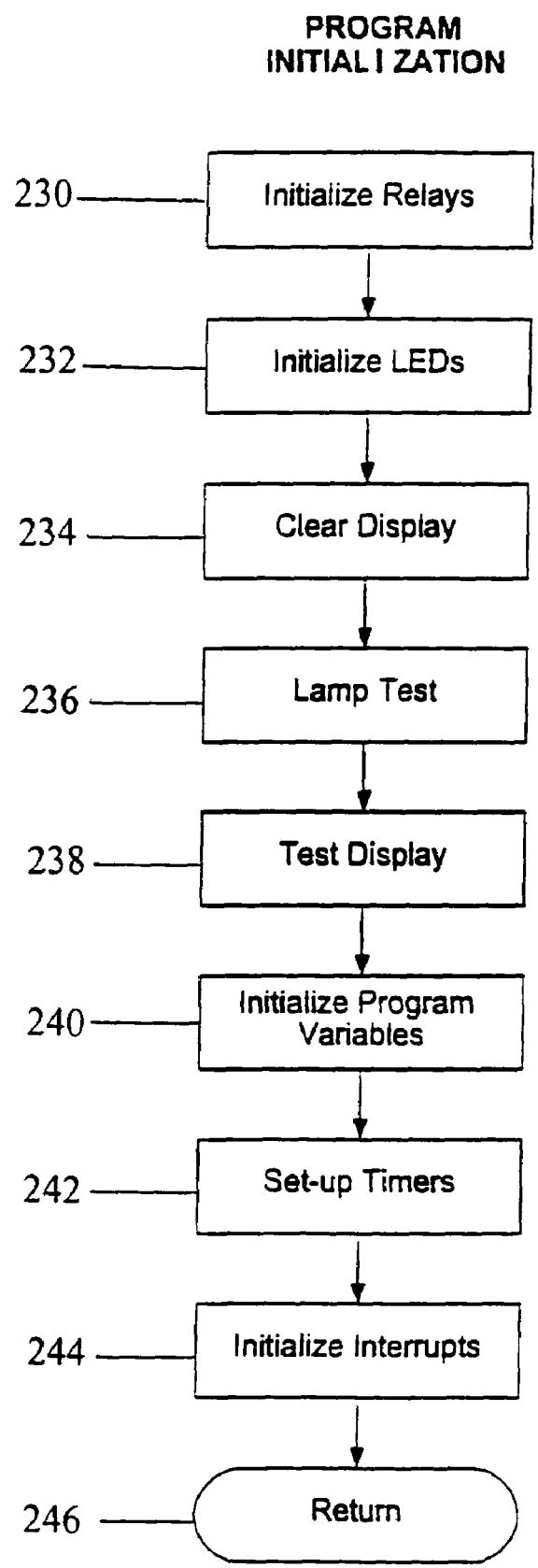
FIGS. 7–18 are a series of flowcharts illustrating various subroutines carried out in the main loop of the operating program of the present invention as shown in FIG. 6.

The main program loop is initiated by the microprocessor 86 at step 200 followed by program initialization at step 202. The program initialization routine is shown in FIG. 7 and begins with an initialization of the relays at step 230 followed by initialization of the LEDs at step 232. The LED display 66 on the electronic timer digital circuit 50 is then cleared at step 234 followed by a lamp test at step 236. The display is then tested at step 238 to verify its proper operation, followed by a initialization of program variables within the microprocessor 86 at step 240. This is followed by the set-up of the system timers at step 242 and the initialization of program interrupts at step 244. The initialization program then returns to the main program loop at step 246.

Figure 8:
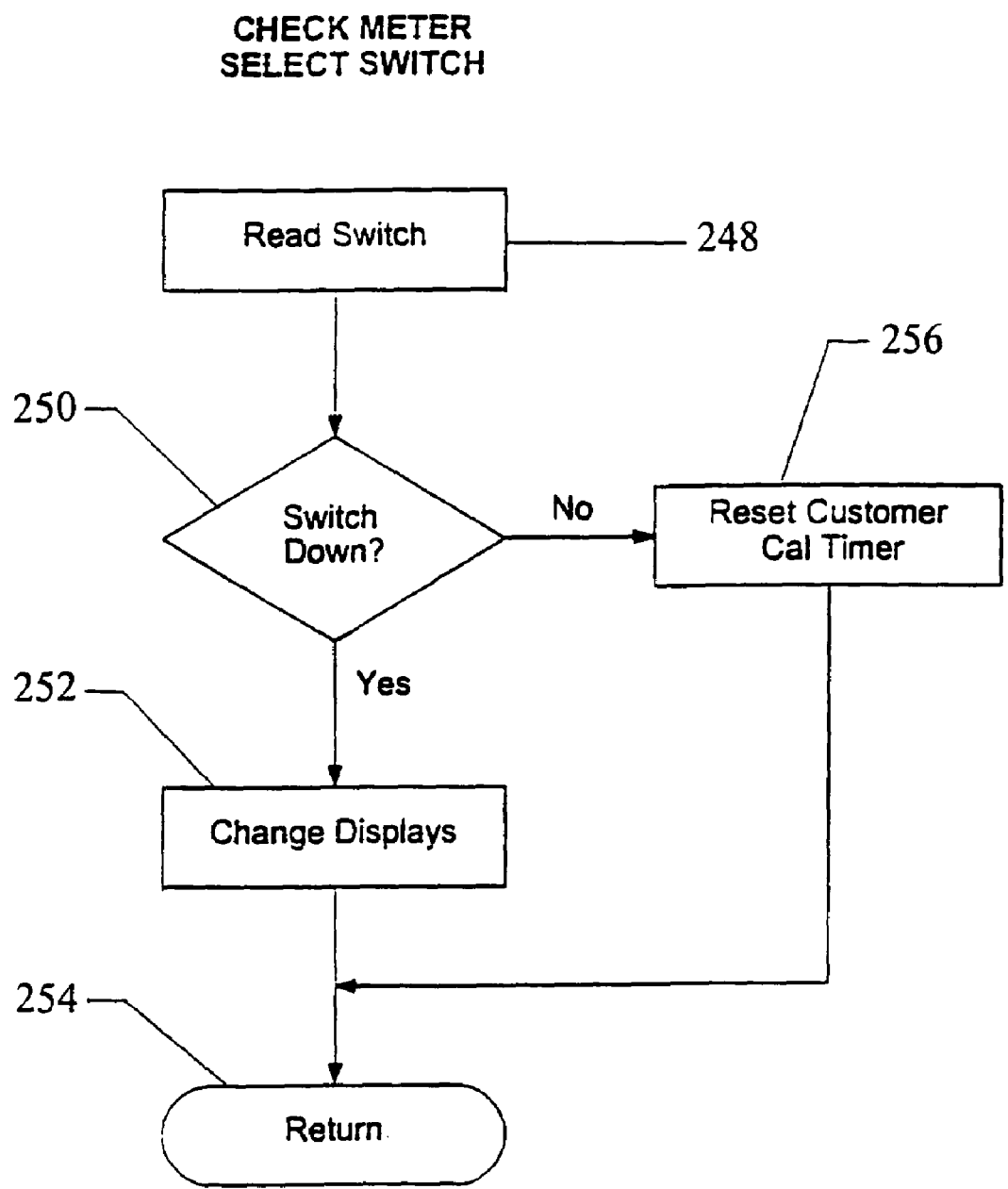

The next step in the main program loop involves checking the meter select switch 72 on the control panel of the electronic timer digital circuit 50 at step 204. The check meter select switch routine is shown in FIG. 8 and begins with a reading of the status of the select switch 72 at step 248. The operating program in the microprocessor 86 then determines the state of the switch at step 250. If the select switch 72 is in the down position as determined at step 250, the program proceeds to step 252 for changing the displays. The voltage and current display are set to the parameters selected by the operator. The program then returns to the main program loop at step 254. If at step 250 it is determined that the select switch 72 is not down, the program then resets the customer calibration timer at step 256 and then returns to the main program loop at step 254. The customer calibration timer is reset in accordance with the test parameters selected by the operator, i.e., number of battery cells being tested, amp hour rating of the battery being tested for a given current load, etc.

Figure 9:
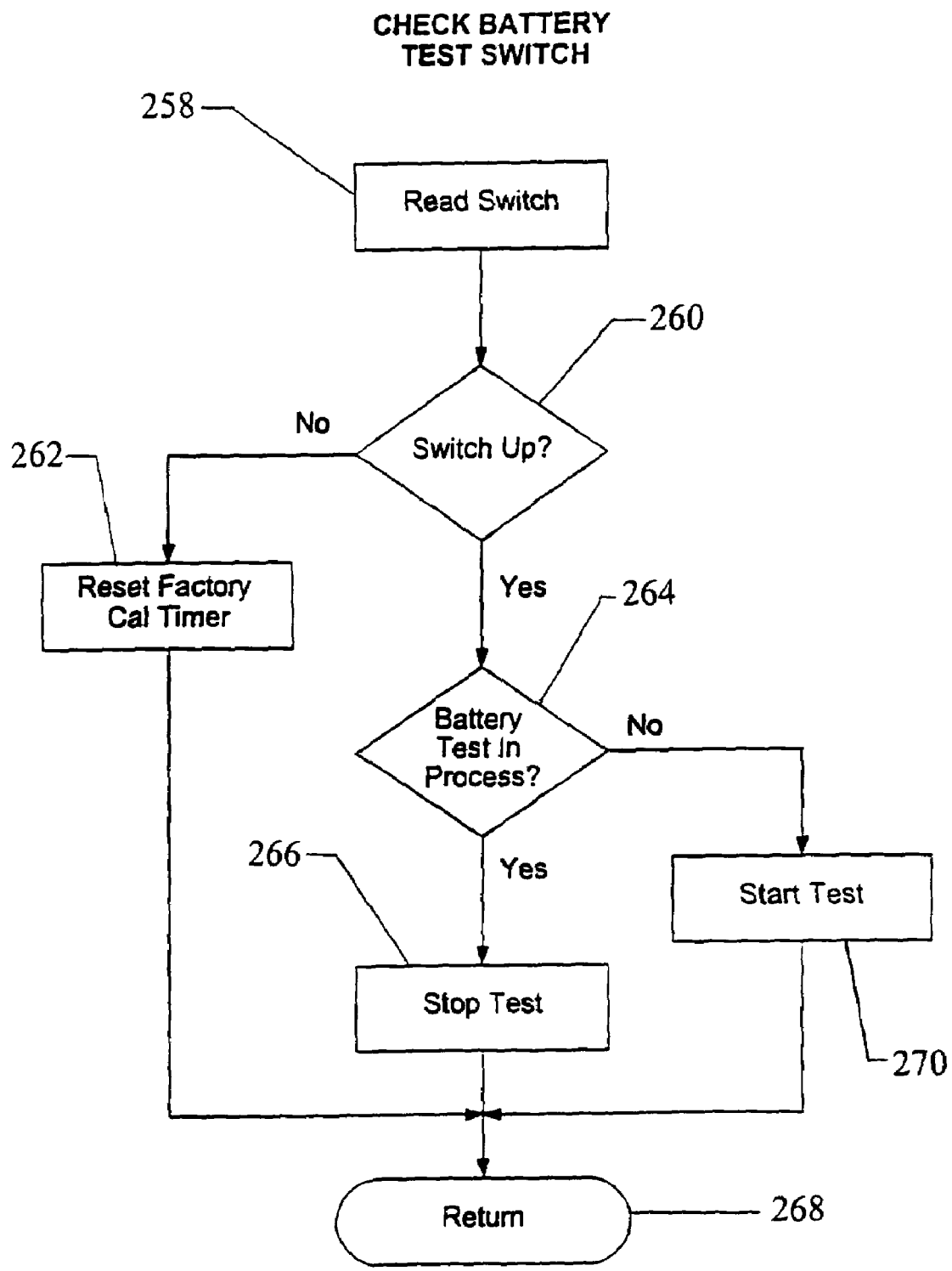

The main program loop then checks the status of the battery test switch 72 at step 206 which is shown in greater detail in FIG. 9. The check battery test switch routine 206 is initiated at step 258 by reading the status of the switch, followed by a determination of whether the battery test switch is in the up position at step 260. If at step 260 it is determined that the battery test switch is not in the up position, the program proceeds to step 262 and resets the factory calibration timer and then returns to the main program loop at step 268. If at step 260 it is determined that the battery test switch is in the up position, the program proceeds to step 264 and determines whether a battery test is currently in process. If a battery test is in process, the program proceeds to step 266, stops the battery test, and proceeds to step 268 in executing a return to the main program loop. If at step 264, it is determined that there is not currently a battery test in process, the program proceed to step 270 and initiates a start test sequence and then returns to the main program loop at step 268.

Figure 10:
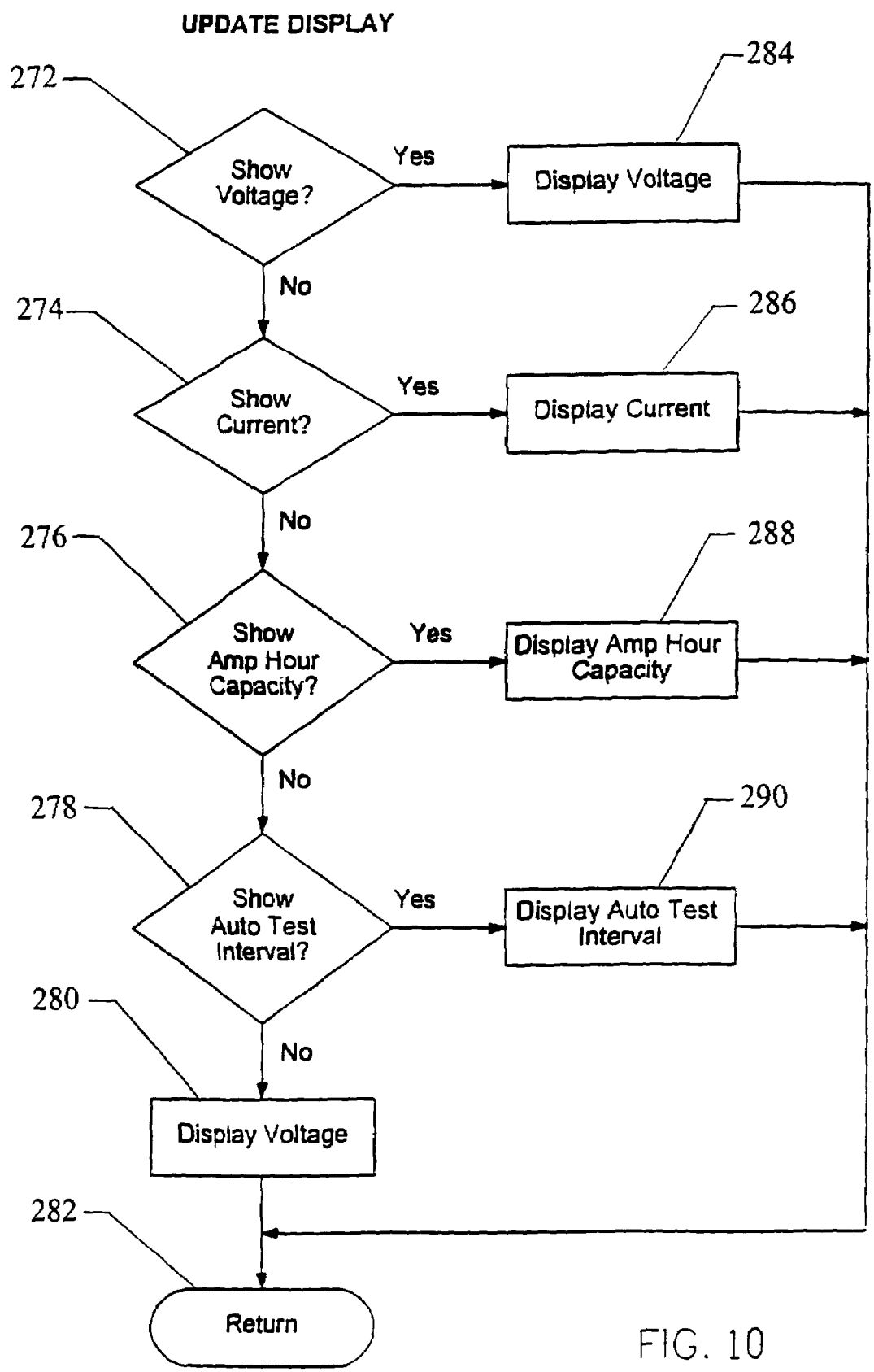

Following the check of the battery test switch at step 206 in the main program loop, the program proceeds to step 208 and reads the output voltage of the battery under test. The LED display 66 is then updated at step 210 by determining which parameter has been selected for display and then displaying the selected parameter. Thus, as shown in FIG. 10, at step 272 the program determines if the voltage has been selected for display. If the voltage has been selected, a voltage is displayed at step 284, with the program returning to the main program loop at step 282. Similarly, at steps 274, 276 and 278 the program determines whether the current, amp hour capacity, or the auto test interval has been selected, respectively, followed by display of the selected parameter such as the display of current at step 286, the display of amp hour capacity at step 288, or the display of the auto test interval at step 290. Following display of any of these selected parameters, the program then returns to the main program loop at step 282. If none of the aforementioned parameters has been selected for display, the program at step 280 displays the voltage and then returns to the main program loop at step 282.

Figure 11:
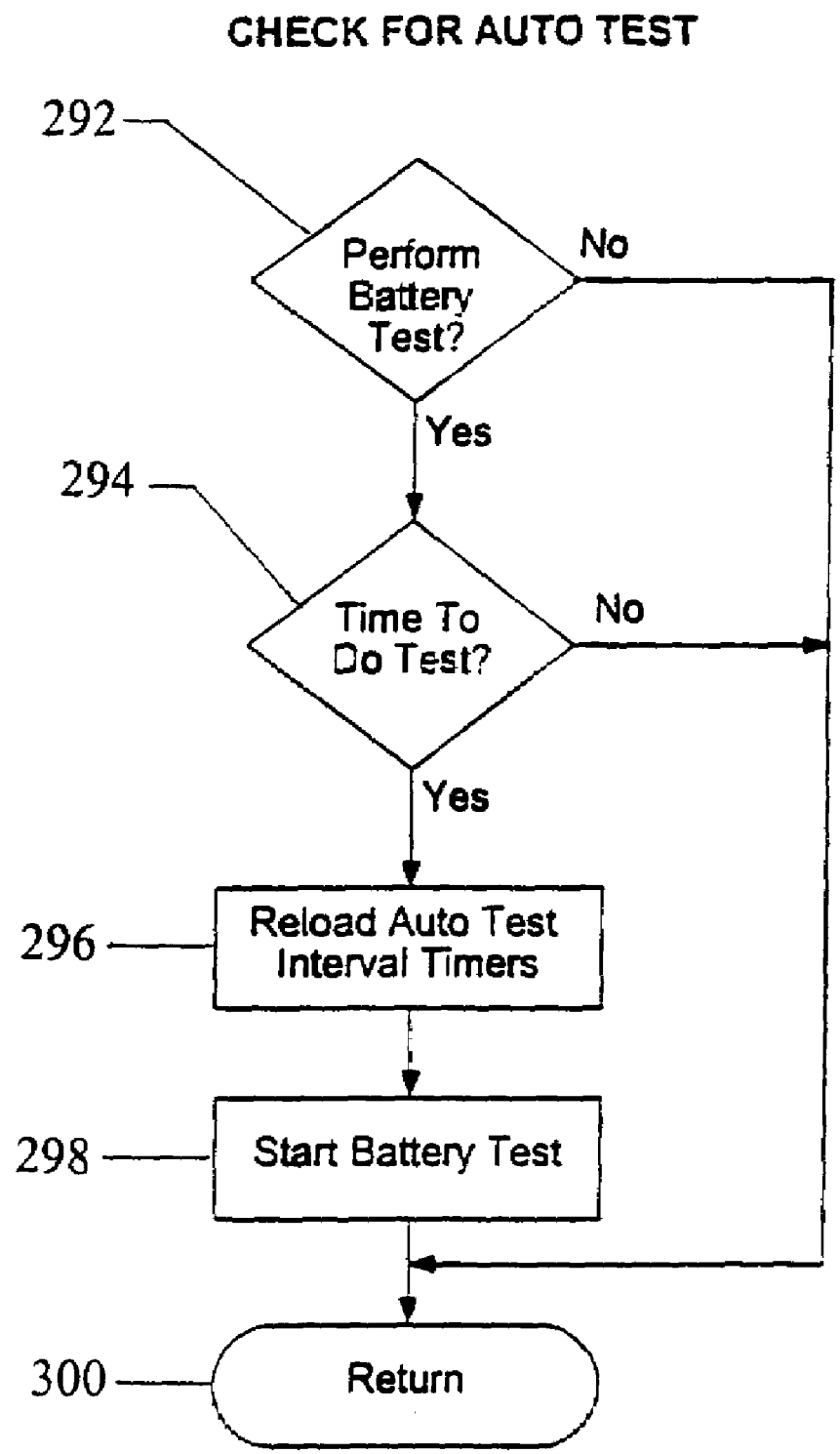

Following updating of the display at step 210, the program proceeds to step 212 for checking for selection of the automatic test mode. As shown in FIG. 11, the automatic test check is initiated at step 292 by a determination of whether the battery test has been selected. If the battery test has not been selected, the program returns to the main program loop at step 300. If it is determined at step 292 that the battery test has been selected, the program proceeds to step 294 to determine if there is sufficient time to perform the test. If it is determined at step 294 that there is insufficient time to perform the battery test, the program returns to the main program loop at step 300. If at step 294 it is determined that there is sufficient time to perform the battery test, the program proceeds to step 296 and reloads the auto test interval timers and initiates an automatic battery test at step 298. The program then returns to the main program loop at step 300.

Figure 12:
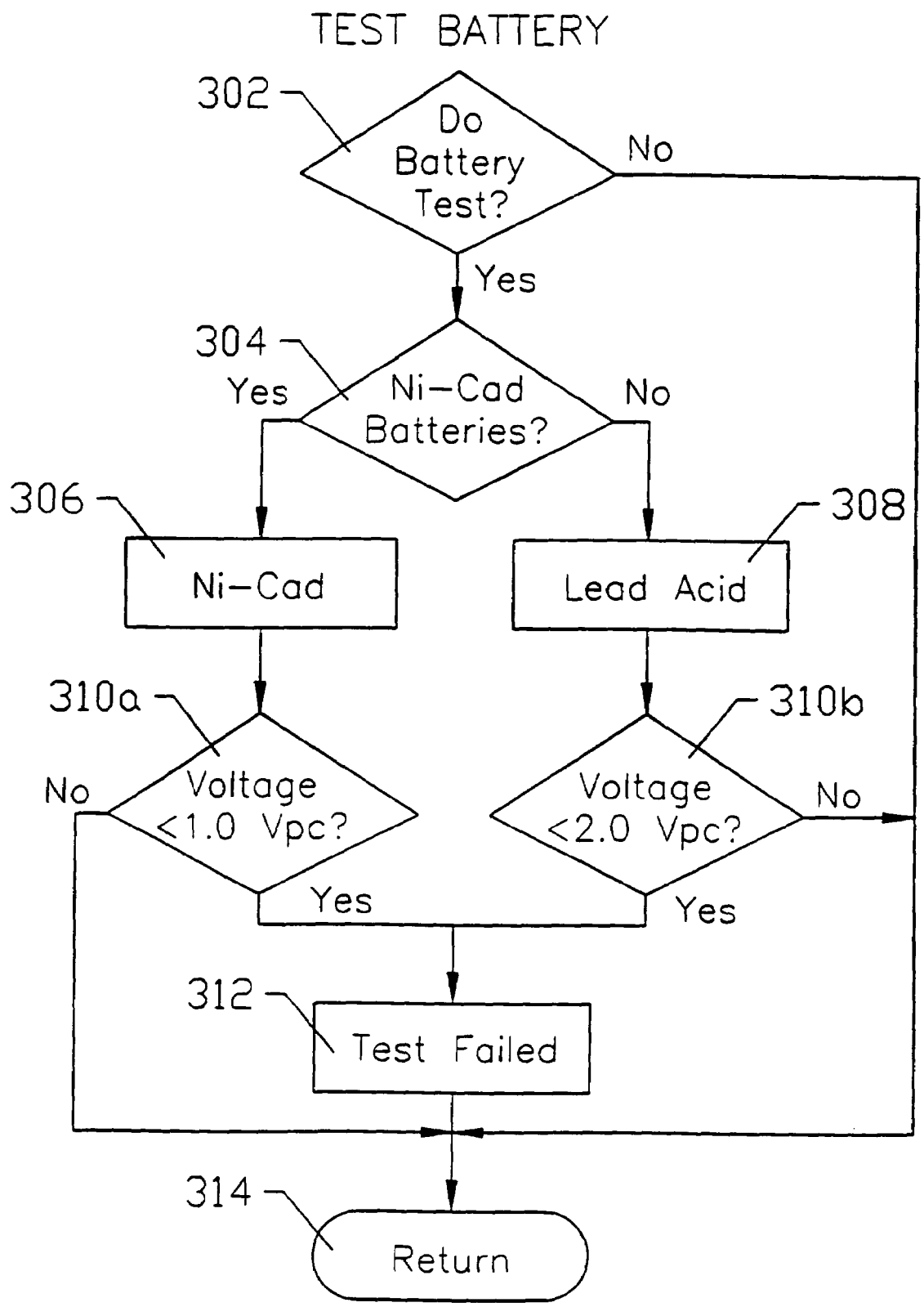

Following checking for the selection of the auto test mode at step 212, the program then proceeds to step 214 for testing a battery which is initiated at step 302 as shown in FIG. 12 by a determination as to whether the battery test mode has been selected. If at step 302 it is determined that the battery test mode has not been selected, the program returns to the main program loop at step 314. If at step 302 it is determined that a battery test has been selected, the program proceeds to step 304 for determining whether the batteries to be tested are Ni-Cad batteries. If it is determined at step 304 that the batteries to be tested are Ni-Cad batteries, the program proceeds to step 306 for battery testing and then determines at step 310a if the measured voltage is less than 1.0 Vpc (Volts per cell). Similarly, if at step 304 it is determined that the batteries to be tested are not Ni-Cad batteries, the program at step 308 performs a lead acid battery test and proceeds to step 310b to determine if the measured battery voltage is less than 2.0 Vpc. If the measured voltage as determined at step 310a is not less than 1.0 Vpc or as determined at step 310b is not less than 2.0 Vpc, the program determines that the test has been passed and returns to the main program loop at step 314. If it is determined at step 310a that the measured battery voltage is less than 1.0 Vpc or at step 310b that the measured battery voltage is less than 2.0 Vpc, the program proceeds to step 312 and provides an indication that the battery has failed the test and then returns to the main program loop at step 314. The test mode for a Ni-Cad battery or a lead acid battery is set by the operator prior to testing by means of manual switch 106.

Figure 13:
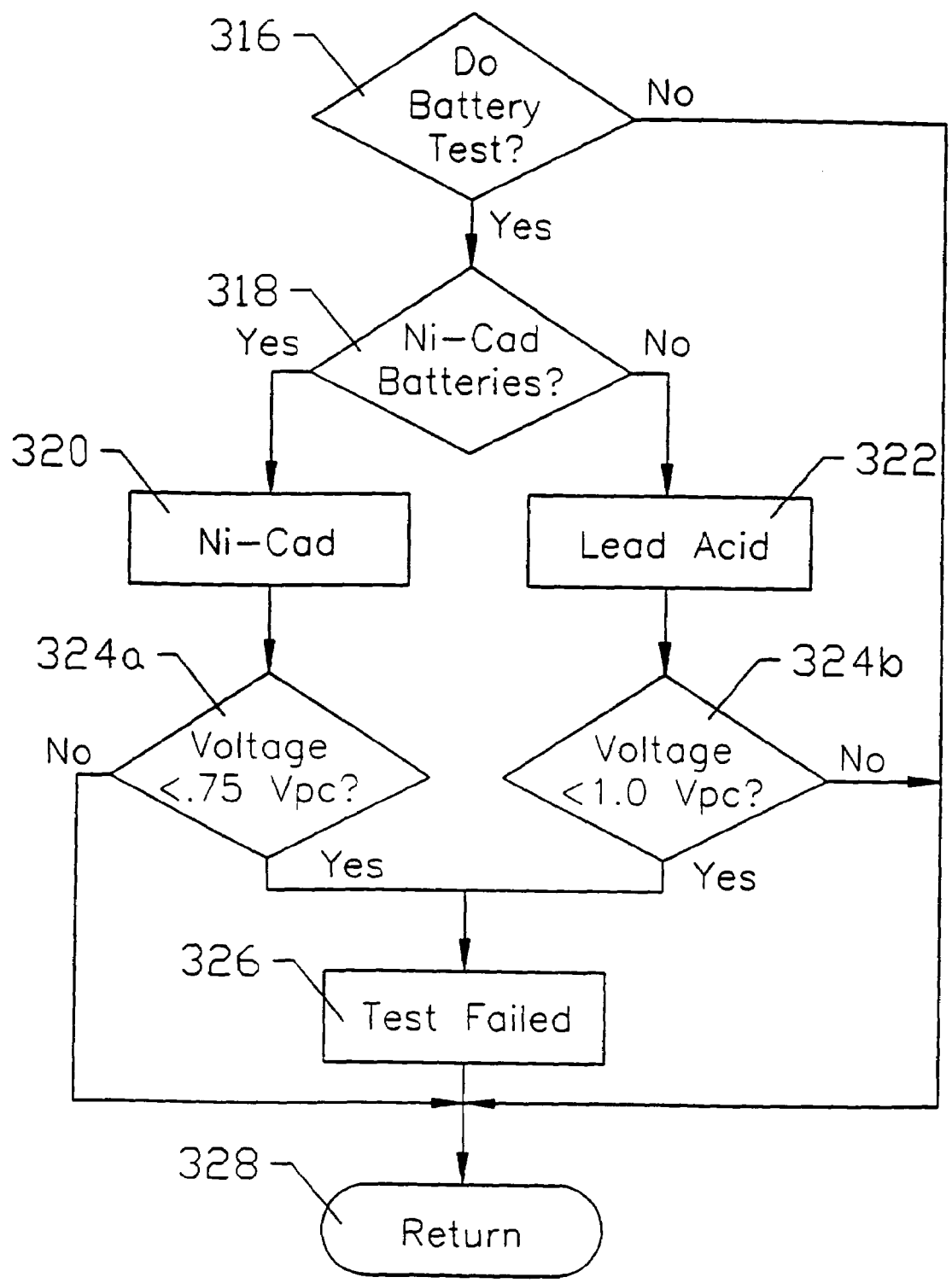

After the initial testing of the battery at step 214, the battery is then subjected to an open cell detection test at step 216 which is initiated at step 316 as shown in FIG. 13 following a determination that the battery test has been selected. If battery test has not be selected as determined at step 316, the program returns to the main program loop at step 328. If at step 316 it is determined that battery test has been selected, the program proceeds to step 318 to determine if the batteries being tested are Ni-Cad batteries. If at step 318 it is determined that the batteries are Ni-Cad batteries, the program then proceeds to step 320 and performs the appropriate test. If at step 318 it is determined that the batteries being tested are not Ni-Cad batteries, the program proceeds to a lead acid battery test at step 322. Following testing of Ni-Cad batteries at step 320 or lead acid batteries in step 322, the program proceeds either to step 324a to determine if the measured battery voltage is less than 0.75 Vpc for Ni-Cad batteries or to step 324b to determine if the measured battery voltage is less than 1.0 Vpc for lead acid batteries. If at step 324a the measured voltage is determined to be greater than or equal to 0.75 Vpc, this indicates that the Ni-Cad batteries have successfully passed the open cell test and the program returns to the main program loop at step 328. If at step 324b it is determined that the measured battery voltage is greater than or equal to 1.0 Vpc, the program determines that the lead acid batteries have successfully passed the open cell test and the program then returns to the main program loop at step 328. If the battery fails this open cell test, a visual indication is presented at step 326 on the LED 62 of this occurrence indicating that the failed battery should be replaced immediately and the program returns to the main program loop at step 328.

Figure 14:
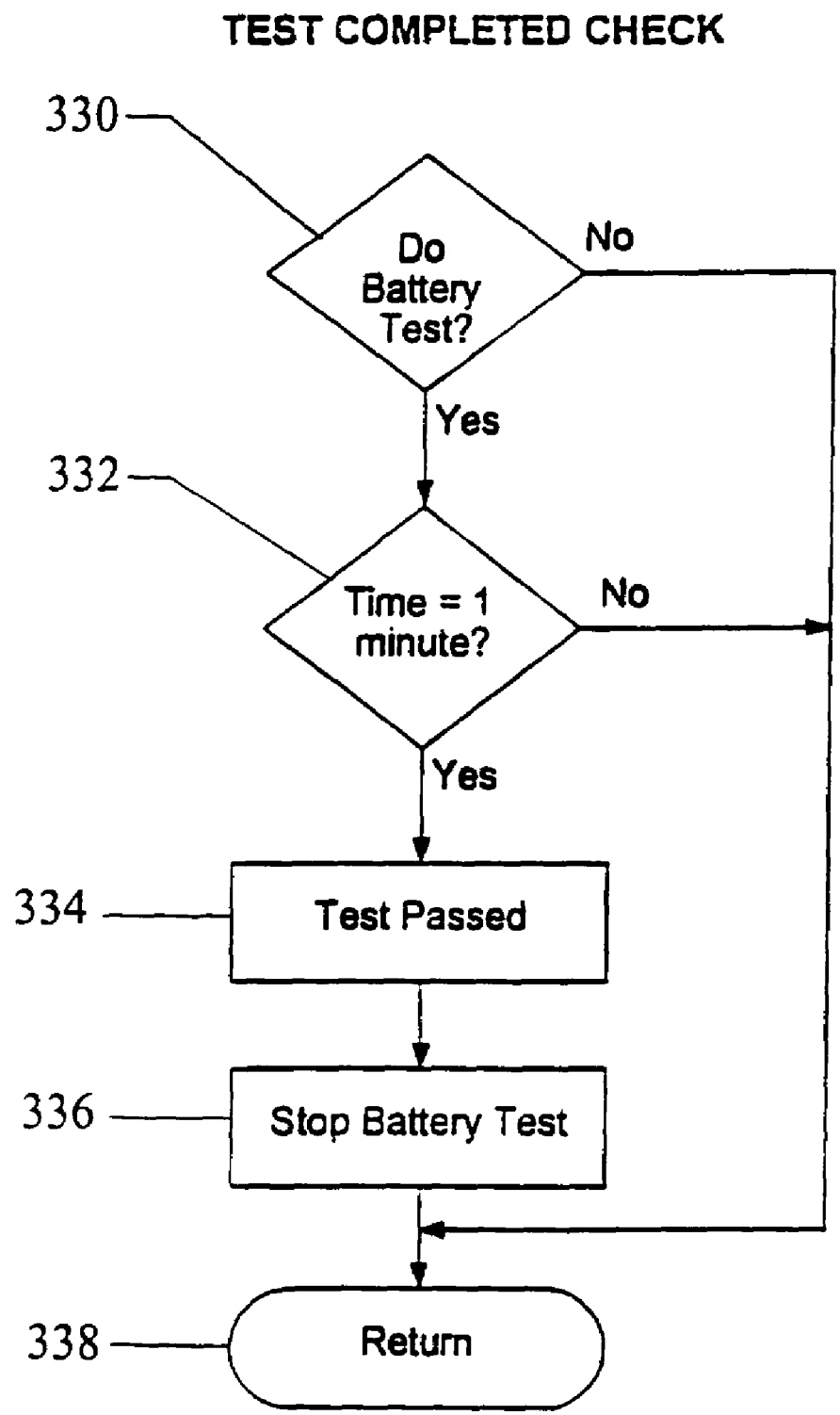

Following the open cell detection test, the program then proceeds to step 218 for determining whether the tests have been completed. As shown in FIG. 14, the test completed check is initiated at step 330 with a determination that the battery test has been selected. If the battery test has not been selected as determined in step 330, the program returns to the main program loop at step 338. If the battery test has been selected, the program proceeds to step 232 and determines if the time required for the test has passed. In the case shown in FIG. 14 the test is 1 minute, but this parameter can be selected as desired by the operator prior to the test. If the time required for the test has passed, the program then proceeds to step 334 and provides an indication that the test has been passed, followed by a termination of the battery test at step 336 and a return to the main program loop at step 338. If the battery under test passes the test, all system states and components such as the various relay contacts are cleared to their initial state or operating condition.

Figure 15:
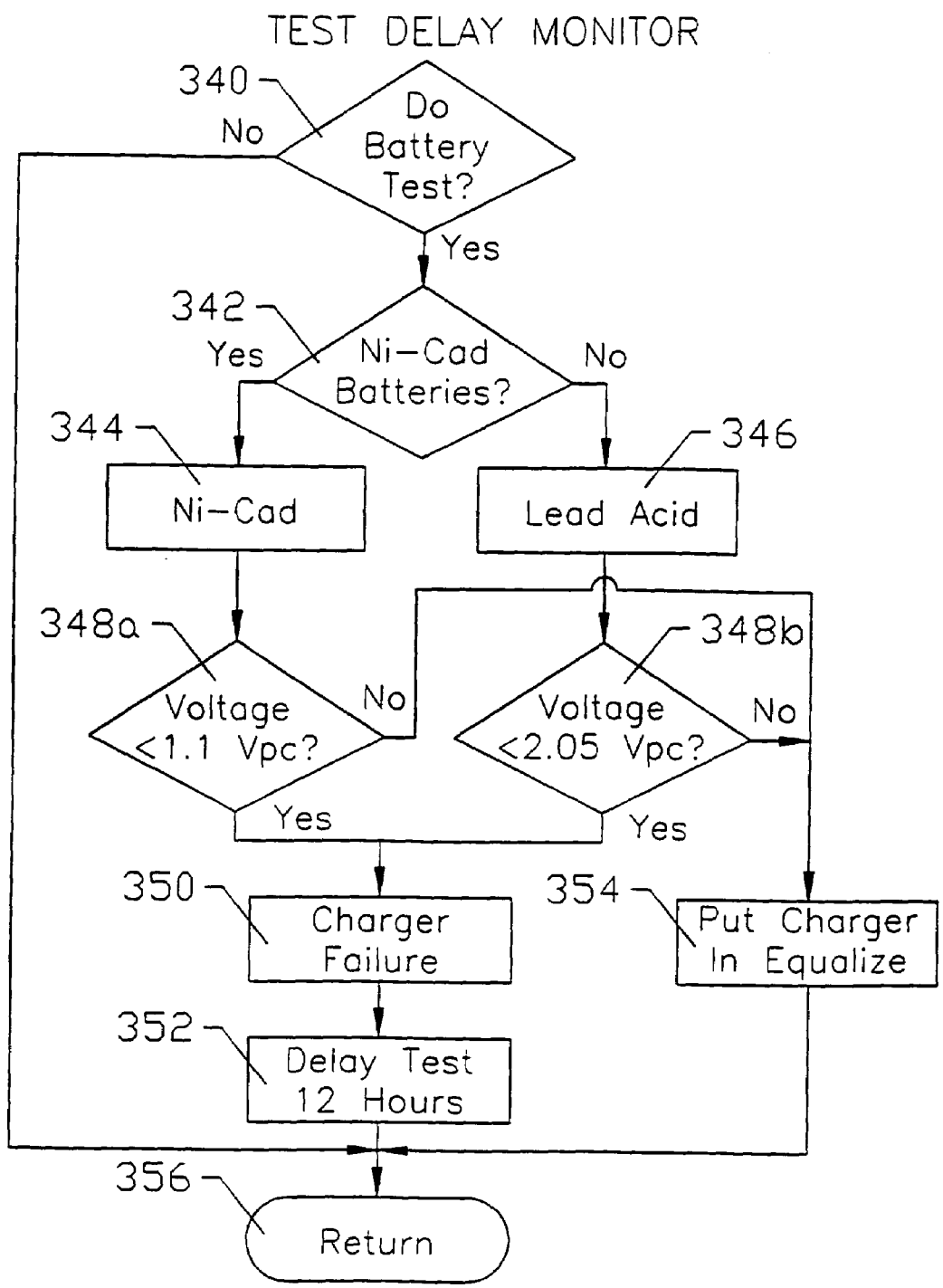

Following completion of the test completed check at step 218, the program proceeds to step 220 for testing the delay monitor. The delay monitor test is initiated at step 340 as shown in FIG. 15 by determining if battery test has been selected. If battery test has not been selected, the program returns to the main program loop at step 356. If at step 340 it is determined that battery test has been selected, the program proceeds to step 342 for determining if the batteries to be tested are Ni-Cad batteries. If at step 342 it is determined that the batteries to be tested are Ni-Cad batteries, the program proceeds to step 344 for testing the Ni-Cad batteries. If at step 342, it is determined that the batteries to be tested are not Ni-Cad batteries, the program proceeds to step 346 for testing lead acid batteries. After testing the Ni-Cad batteries at step 344 the program then determines at step 348a if the battery voltage is less than 1.1 Vpc. If the Ni-Cad battery voltage is greater than or equal to 1.1 Vpc, the program proceeds to step 354 for placing the battery charger in the equalize mode, followed by a return to the main program loop at step 356. After testing the lead acid batteries at step 346, the program then determines at step 348b if the battery output voltage is less than 2.05 Vpc. If it is determined that the lead acid battery output voltage is greater than or equal to 2.05 Vpc, the program proceeds to step 354 for placing the battery charger in the equalize mode, followed by a return to the main program loop at step 356. If the lead acid battery output voltage is less than 2.05 Vpc as determined at step 348b or the Ni-Cad battery output voltage is less than 1.1 Vpc as determined at step 348a, a determination is made at step 350 that the charger has failed and the program then proceeds to step 352 for delaying the next test of the battery for 12 hours. Failure of the battery charger results in illumination of an LED for alerting the operator. The program then proceeds to step 356 for returning to the main program loop. A battery not connected to anything will provide an output voltage of 2.0 Vpc. The float voltage at which a battery is charged is 2.17 Vpc. If the battery voltage is measured at less than 2.05 Vpc, it is determined that the battery charger has failed.

Figure 16:
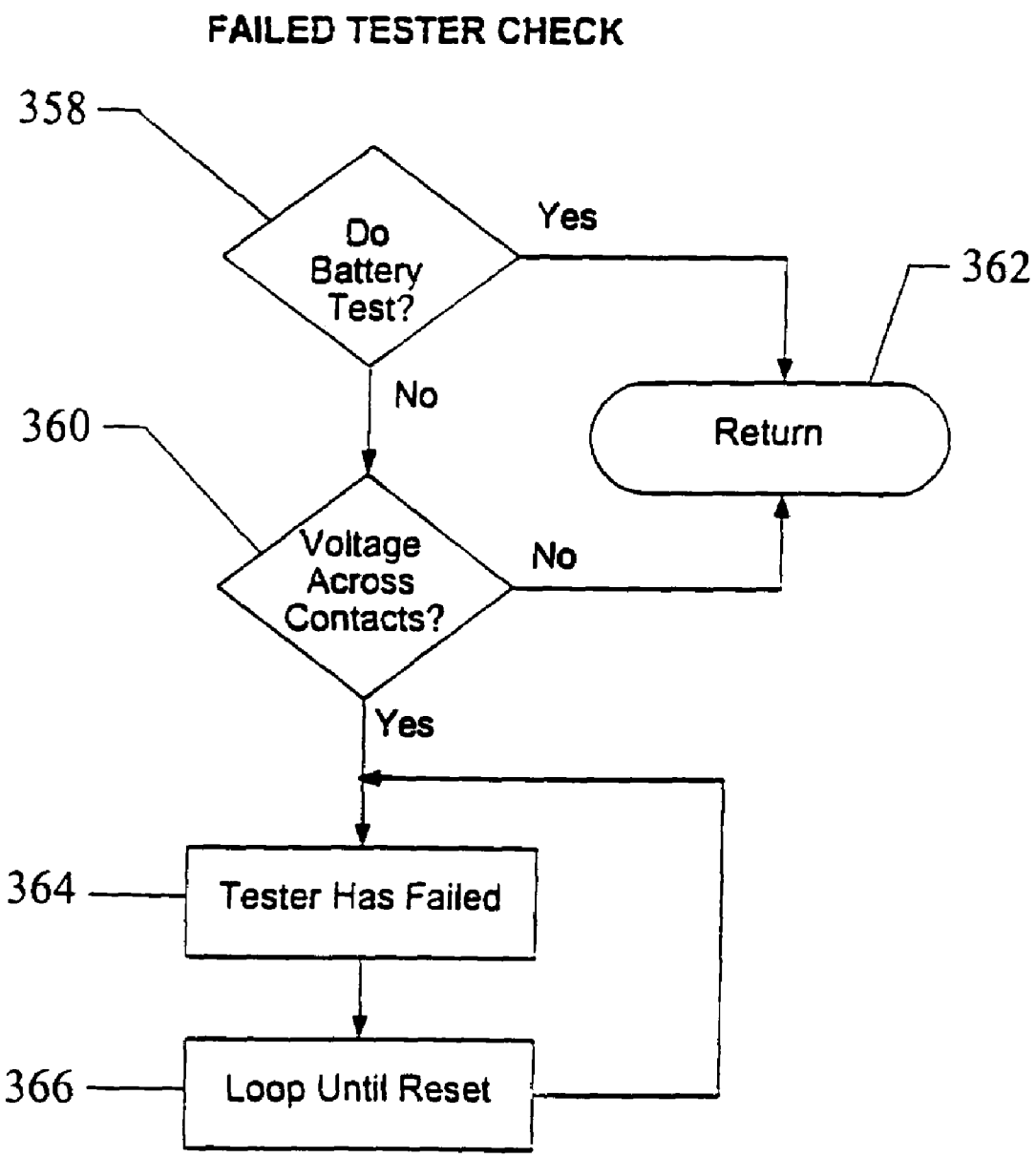

Following the monitoring for a test delay at step 220, the main program loop then proceeds to step 222 for performing a failed tester check. The failed tester check is initiated at step 358 as shown in FIG. 16 with a determination if the battery test has been selected. If the battery test has been selected, the program proceeds to step 362 and returns to the main program loop. If at step 358 it is determined that the battery test has not been selected, the program proceeds to step 360 and determines if there is a voltage across the contacts of the battery tester. When performing a battery test, relay contacts 38 should be closed and there should not be a voltage across the battery tester's contacts. If there is no voltage across the contacts of the battery tester as determined at step 360, the program proceeds to step 362 and returns to the main program loop. If at step 360 it is determined that there is a voltage applied across the contacts of the battery tester, the program at step 364 then determines that the tester has failed. After determining that the tester has failed at step 364, the program proceeds to step 366 for executing a loop until the tester is reset. This loop continues until the battery tester has been reset.

Figure 17:
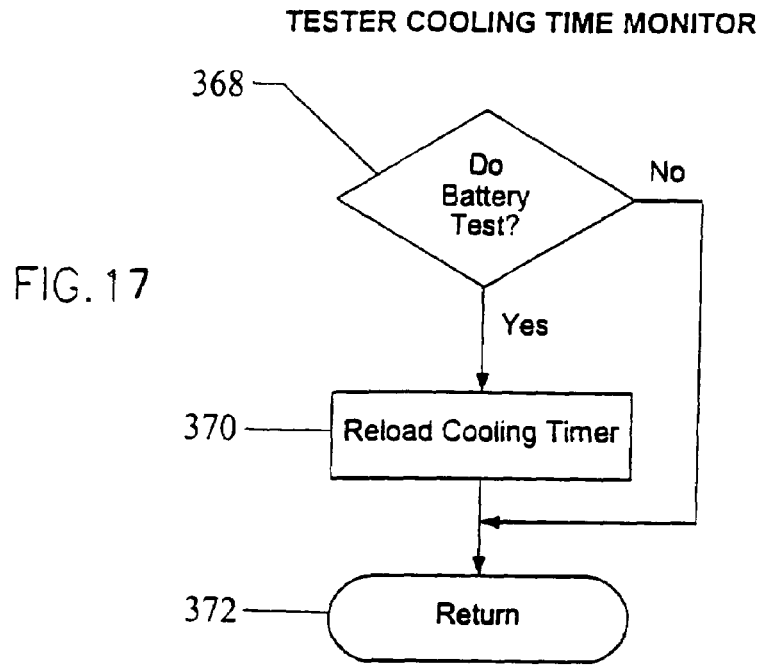
Figure 18:
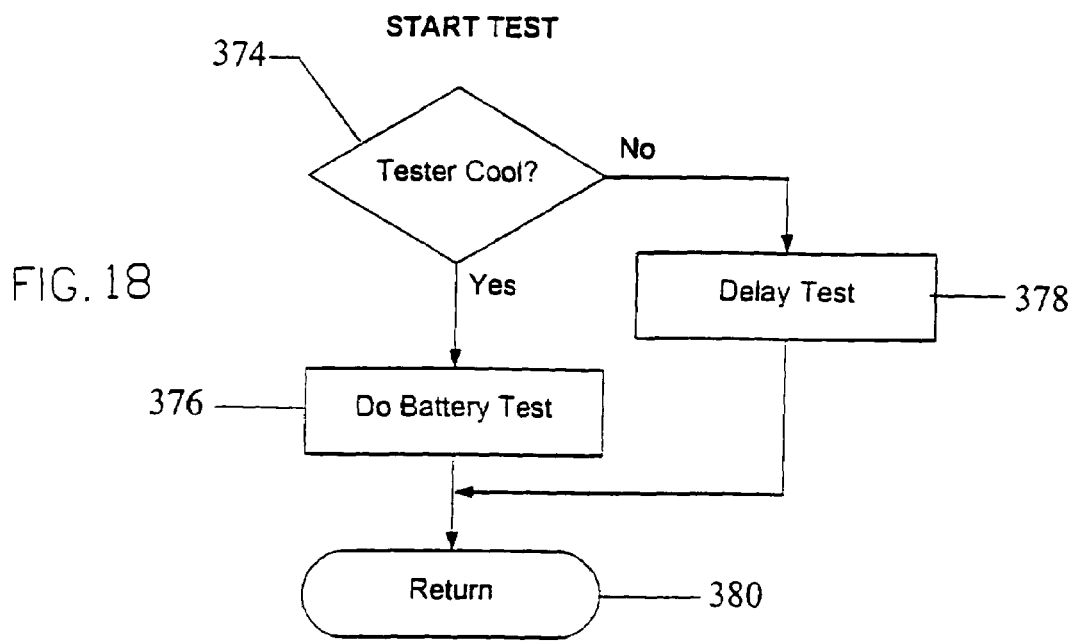

Following the performance of a failed tester check at step 222, the main program loop proceeds to step 224 for monitoring the battery tester cooling time. Monitoring tester cooling time is initiated at step 368 as shown in FIG. 17 for the purpose of determining whether a battery test has been selected. If at step 368 it is determined that the battery test has not been selected, the program proceeds to step 372 for returning to the main program loop. If at step 368 it is determined that the battery test has been selected, the program proceeds to step 370 for reloading the cooling timer constant, followed by a return to the main program loop at step 372. The reloading of the cooling timer constant is important in the manual mode of operation to protect various electronic components such as resistors and diodes from damage due to overheating caused by excessive testing. The program then proceeds to the start test procedure at step 226 which is initiated at step 374 as shown in FIG. 18 with a determination of whether the battery tester has cooled down sufficiently to initiate a battery test. If at step 374 it is determined that the battery tester has not cooled down sufficiently, the program then proceeds to step 378 for delaying initiation of a battery test, followed by a return to the main program loop at step 380 after the delay has expired. If at step 374 it is determined that the temperature of the battery tester is low enough to conduct a battery test, the battery test is conducted at step 376 followed by a return to the main program loop, at step 380. Following this start test procedure carried out at step 226, the main program loop concludes by carrying out the test completed check at step 228 which was previously described. The main program loop is then reinitiated by returning to the check meter select switch operation at step 204.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. An arrangement for testing a battery connected to a battery charger and a work load, said arrangement comprising:
   first conductor means for connecting the battery to the battery charger and work load under normal operating conditions allowing the battery to drive the work load and the battery charger to charge the battery;
   second conductor means coupled in parallel across said first conductor means, wherein said second conductor means is nonconductive under normal operating conditions;
   user selectable means responsive to an input for initiating testing of the battery; and
   control/detection means coupled to said first and second conductor means and to said selectable means for conducting a battery test, wherein said control/detection means renders said first conductor means nonconductive and said second conductor means conductive during a battery test for isolating the battery from the battery charger while permitting the battery to continue to energize the work load during testing, and wherein said control/detection means applies a test load across the battery for measuring battery voltage during testing.

2. The arrangement of claim 1 wherein said first conductor means comprises first relay contacts and said second conductor means comprises a unidirectional conductor.

3. The arrangement of claim 2 wherein said unidirectional conductor is a diode.

4. The arrangement of claim 3 wherein said test load comprises serially connected second relay contacts and a resistor coupled across first and second terminals of the battery.

5. The arrangement of claim 4 wherein said control/detection means closes said first relay contacts and opens said second relay contacts under normal operating conditions, and opens said first relay contacts and closes said second relay contacts for battery testing.

6. The arrangement of claim 1 further comprising means for detecting and providing an indication of failure of the battery charger.

7. The arrangement of claim 1 further comprising means for detecting and providing an indication of failure of the arrangement for testing a battery.

8. The arrangement of claim 1 further comprising means for manually testing the battery as desired or for automatically testing the battery at predetermined time intervals.

9. The arrangement of claim 1 further comprising means for charging the battery in a auto-equalized mode following detection of a weak battery.

10. The arrangement of claim 1 further comprising means for delaying for a selected time period testing of the battery following loss of power to the battery and battery charger.

11. A method for testing the condition of a battery connected to a battery charger and a work load comprising the steps of:
   measuring a first output voltage $V_o$ of the battery;
   comparing the first output voltage $V_o$ with a float voltage $V_F$ and providing a first indication that the battery is being charged if $V_0 > V_F$;
   applying a test load to the battery and measuring a second output voltage under load $V_1$ and providing a second indication of an open cell in the battery if $V_1 < 0.75$ Volts per cell; and
   comparing the second output voltage under load $V_1$ to a reference voltage $V_R$, where $V_R < V_F$, and providing a third indication of a good battery if $V_1 > V_R$ or a fourth indication of a weak battery if $V_1 < V_R$.

12. The method of claim 11 further comprising the step of initiating an auto-equalized test mode in the case where the test indicates a weak battery, where $V_1 < V_R$.

13. The method of claim 11 wherein the step of measuring the first output voltage $V_o$ of the battery includes isolating the battery charger from the battery while continuing to allow the battery to energize the work load.

* * * * *